(12) United States Patent
Huang

(10) Patent No.: US 6,756,650 B2
(45) Date of Patent: Jun. 29, 2004

(54) LENS CAP FOR TRANSISTOR OUTLINE PACKAGE

(75) Inventor: Nan Tsung Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 43 days.

(21) Appl. No.: 10/142,448

(22) Filed: May 9, 2002

(65) Prior Publication Data

US 2003/0197237 A1 Oct. 23, 2003

(30) Foreign Application Priority Data

Apr. 18, 2002 (TW) ........................................ 91205238 U

(51) Int. Cl.[7] ........................................... H01L 31/0203
(52) U.S. Cl. ........................................ 257/434; 257/704
(58) Field of Search .................................. 257/434, 704

(56) References Cited

U.S. PATENT DOCUMENTS 5,579,164 A * 11/1996 Chapnik ..................... 359/618
5,835,514 A * 11/1998 Yuen et al. .................. 372/36

* cited by examiner

Primary Examiner—Luan Thai
(74) Attorney, Agent, or Firm—Wei Te Chung

(57) ABSTRACT

A lens cap (40) for a transistor outline package includes a lens part (3) and a hollow main part (2) adapted for receiving optoelectronic components. The lens part includes a ball lens (30) having a first groove (27) and a sprue filling portion (31) having a second groove (25). The main part defines an opening (23) which comprises a ball lens receiving hole (231) and a sprue (232). A protruding sidestep (24) is formed along an inner surface of the sprue. The lens part is firmly coupled to the main part through engagement of the protruding sidestep with the second groove and a circular rim (26) of the main part with the first groove. The lens cap is manufactured by insert molding the lens part in the opening, with an injection hole (53) feeding into the sprue. Thus, gluing is avoided, and the ball lens optics are consistently good.

12 Claims, 3 Drawing Sheets

LENS CAP FOR TRANSISTOR OUTLINE PACKAGE

FIELD OF THE INVENTION

The present invention generally relates to lens caps for transistor outline packages adapted to package optoelectronic components, and particularly to ball lens caps for said transistor outline packages.

BACKGROUND OF THE INVENTION

Optoelectronic components, such as optical coupling devices, generally require a lens cap to protect them from damage and from EMI (Electro Magnetic Interference). Without such protection, damage can result from exposure to moisture, dirt, heat, radiation, or other hazards. The lens cap generally comprises a main part and a lens part. The lens part is usually coupled to the main part by gluing, as disclosed in Japanese Application 2-165684However, the lens part is often contaminated by dispersion of the glue and then its optical characteristics are affected. In addition, there is a danger that the lens part will become separated from the main part of the housing if the glue loses effectiveness over time. Furthermore, the lens cap is unduly costly due to its time-consuming manufacturing method.

Therefore, an improved lens cap for a transistor outline package that overcomes the above-mentioned disadvantages is desired.

SUMMARY OF THE INVENTION

A main object of the present invention is to provide a lens cap for a transistor outline package which holds up over time and whose optical characteristics are reliably good.

Another object of the present invention is to provide a cheap lens cap for a transistor outline package which is suitable for mass production.

To achieve the above objects, a lens cap for a transistor outline package comprises a lens part and a hollow main part adapted for receiving optoelectronic components. The lens part includes a ball lens having a first groove and a sprue filling portion having a second groove. The main part defines an opening which comprises a ball lens receiving hole communicating with a sprue. A sidestep is formed along an edge of the opening protruding into the sprue. The ball lens has a diameter greater than the ball lens receiving hole. The lens part is thus firmly coupled to the main part of the lens cap through the engagement of the protruding sidestep with the second groove and a circular rim of the main part with the first groove.

Other objects, advantages and novel features of the invention will become more apparent from the following detailed description of a preferred embodiment thereof when taken in conjunction with the accompanying drawings, wherein:

DETAILED DESCRIPTION OF THE INVENTION

Figure 1:
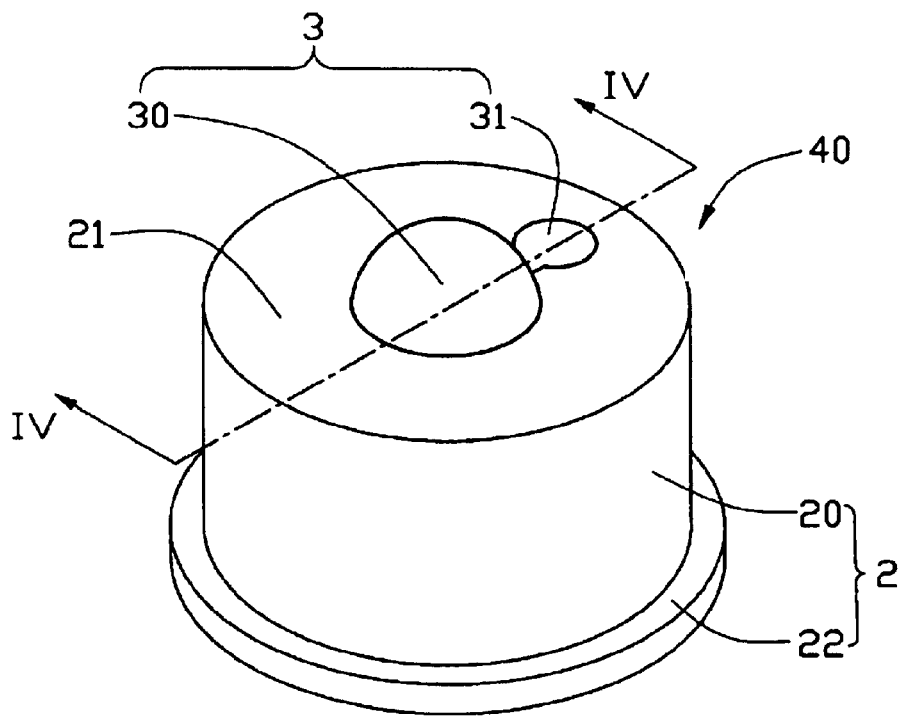
FIG. 1 is a perspective view of a lens cap for a transistor outline package in accordance with a preferred embodiment of the present invention.

Referring now to the drawings in detail, FIG. 1 shows a ball lens cap 40 in accordance with a preferred embodiment of the present invention. The ball lens cap 40 comprises a transparent lens part 3 and a hollow main part 2 adapted for receiving optoelectronic components (not shown) therein. The lens part 3 can be made of a plastic or other suitable material and the main part 2 can be made of a metallic or other suitable conductive material. The lens part 3 comprises a sprue filling portion 31 and a ball lens 30. The main part 2 has a cylindrical trunk portion 20 with a top panel 21 and an annular edge 22 extending from a lower extremity of the trunk portion 20. The annular edge 22 is suitable for soldering to a base plate (not shown). The base plate (not shown) and the ball lens cap 40 constitute a transistor outline package.

Figure 2:
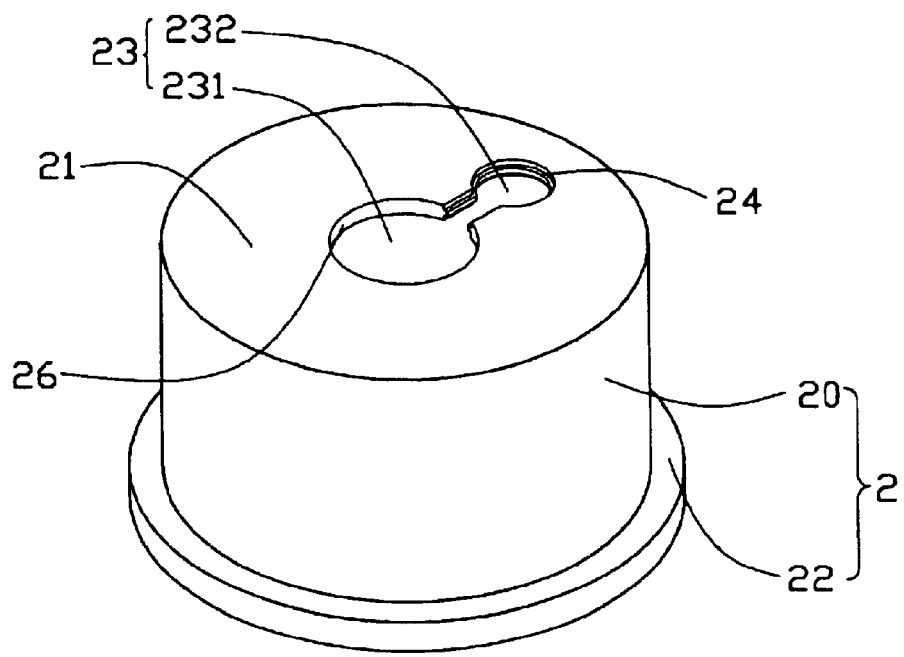
FIG. 2 is a perspective view of the lens cap without a lens part according to FIG. 1.
Figure 3:
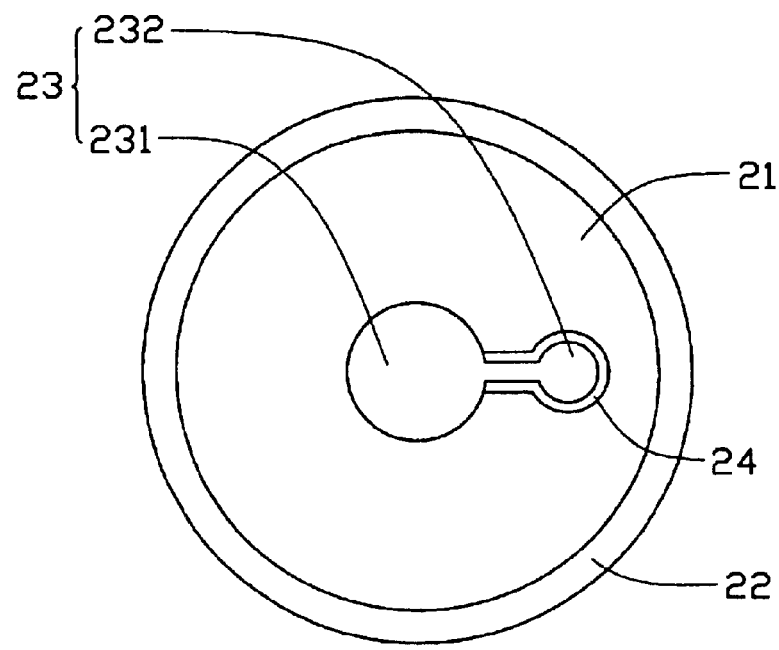
FIG. 3 is a top view of FIG. 2.
Figure 4:
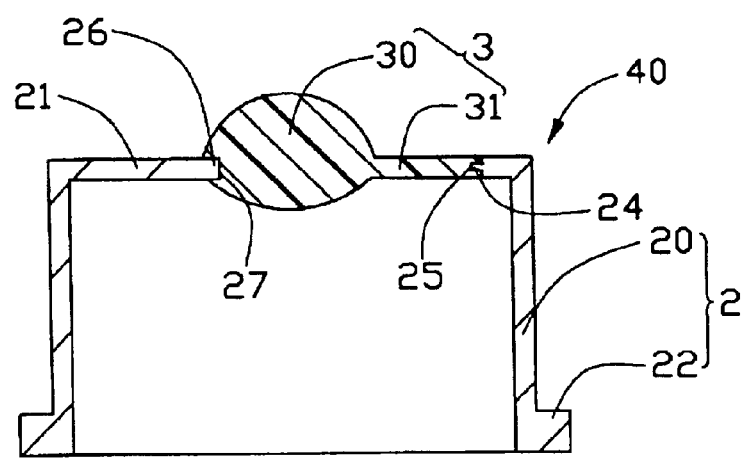
FIG. 4 is a cross-sectional view taken along line IV—IV of FIG. 1.

Now referring to FIGS. 2–4, the trunk portion 20 defines an opening 23 in the top panel 21. The opening 23 comprises a ball lens receiving hole 231 and a sprue 232. A sidestep 24 is formed along an edge of the opening 23 protruding into the sprue 232. The lens part 3 has a first groove 27 around an outer surface of the ball lens 30 and a second groove 25 around an outer surface of the sprue filling portion 31 corresponding to the protruding sidestep 24. The second groove 25 and the first groove 27 are linked together at a boundary between the sprue filling portion 31 and the ball lens 30.

In the present invention, the ball lens 30 has a diameter greater than the ball lens receiving hole 231. The lens part 3 is firmly coupled to the main part 2 of the ball lens cap 40 through the engagement of the first and second grooves 27, 25 with a circular rim 26 around the ball lens receiving hole 231 and the protruding sidestep 24, respectively.

Figure 5:
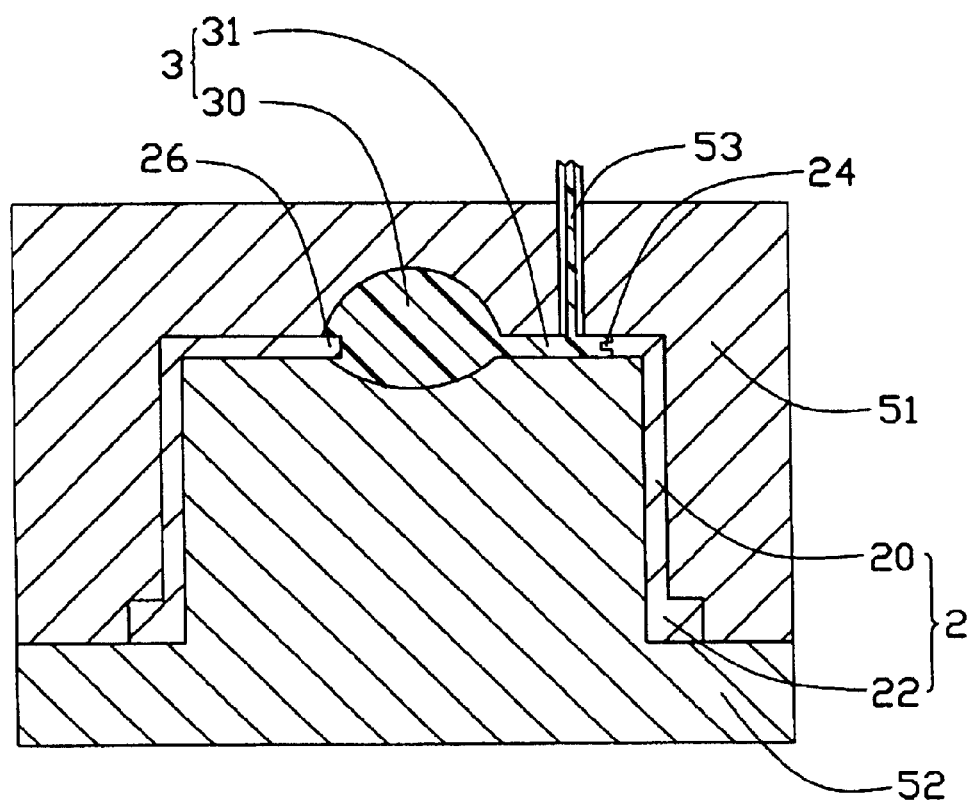
FIG. 5 is a cross-sectional side view of the lens cap of FIG. 1 between a pair of mold halves during insert molding of the lens part.

Referring to FIG. 5, the process of manufacturing the ball lens cap 40 comprises the following steps: (1) providing the main part 2 of the ball lens cap 40; (2) providing the upper and lower molds 51 and 52 and putting the main part 2 into the molds 51, 52; (3) closing the molds 51, 52 and insert molding the lens part 3. In step (3), melted material of the lens part 3 is injected into the molds 51, 52 through an injection hole 53 and first enters into the sprue 232, and then enters into the ball lens receiving hole 231 to form the sprue filling portion 31 and the ball lens 30. In the present invention, the existence of the sprue 232 ensures that the formed ball lens 30 will have good optical characteristics because the optical characteristics of an insert molding near the injecting hole 53 is generally inferior, and the sprue 232 allows the injecting hole 53 to be placed at a distance from the ball lens 30.

It is understood that the invention may be embodied in other forms without departing from the spirit thereof. Thus, the present embodiment is to be considered in all respects as illustrative and not restrictive, and the invention is not to be limited to the details given herein.

What is claimed is:

1. A lens cap for a transistor outline package, comprising:
   a lens part having a first engaging structure, a ball lens, and a sprue filling portion;
   a hollow main part defining an opening, the opening comprising a receiving hole for receiving said ball lens and a sprue substantially accommodating said sprue filling portion, the hollow main part having a second engaging structure corresponding to the first engaging structure;
   wherein the lens part is firmly coupled to the main part through the engagement of the first engaging structure with the second engaging structure.

2. The lens cap as claimed in claim 1, wherein the first engaging structure of the lens part is a groove around an outer surface of the lens part, and the second engaging structure of the main part is a sidestep formed along an edge of the opening and protruding into the sprue and a circular rim of the main part surrounding the ball lens receiving hole.

3. The lens cap as claimed in claim 2, wherein the groove comprises a first groove formed around an outer surface of the ball lens and a second groove formed around an outer surface of the sprue filling portion corresponding to the protruding sidestep.

4. A lens cap for a transistor outline package, the lens cap comprising:
   a lens part comprising a ball lens and a sprue filling portion, with a groove being formed around an outer surface of the lens part;
   a hollow main part defining an opening through one side thereof in communication with a hollow interior, the opening being adapted for receiving the lens part and having a ball lens receiving hole connected to a sprue, and the main part forming a sidestep protruding into the sprue;
   wherein the lens part is firmly coupled to the main part through the engagement of the protruding sidestep in the groove and a circular rim of the main part surrounding the ball lens receiving hole.

5. The lens cap as claimed in claim 4, wherein the groove comprises a first groove formed around an outer surface of the ball lens and a second groove formed around an outer surface of the sprue filling portion and corresponding to the protruding sidestep.

6. The lens cap as claimed in claim 5, wherein the first and second grooves are linked together at the boundary between the sprue filling portion and the ball lens.

7. The lens cap as claimed in claim 4, wherein the main part has a cylindrical trunk portion with a top panel and an annular edge extending from a lower part of the trunk portion.

8. A lens assembly comprising:
   a lens being made from material suitable for injection molding, said lens including a ball lens with dimensions and configurations for optic transmission; and
   a sprue filling portion integrally and substantially uniformly formed with said ball lens, said sprue filling portion outwardly extending from a portion of a periphery of said ball lens and defining a vertical dimension smaller than that of the ball lens; wherein
   said lens is insert molded within a plate and said sprue filling portion defines a position where an injection sprue is located.

9. The lens assembly as claimed in claim 8, wherein complementarily interengaging devices are formed on both the lens and the plate to hold the lens and the plate together.

10. The lens assembly as claimed in claim 8, wherein said vertical dimension of the ball lens is perpendicular to the periphery thereof.

11. The lens assembly as claimed in claim 8, wherein said lens extends through said plate in a direction perpendicular to a plane defined by said plate.

12. The lens assembly as claimed in claim 11, wherein said plate is a part of a cap.

* * * * *